(12) United States Patent
Kraft et al.

(10) Patent No.: US 10,130,982 B2
(45) Date of Patent: Nov. 20, 2018

(54) HOT EXTRUSION DIE TOOL AND METHOD OF MAKING SAME

(71) Applicant: Ohio University, Athens, OH (US)

(72) Inventors: Frank Frederick Kraft, Albany, OH (US); Jared Rich, Cambridge, OH (US)

(73) Assignee: Ohio University, Athens, OH (US)

( * ) Notice: Subject to any disclaimer, the term of this patent is extended or adjusted under 35 U.S.C. 154(b) by 0 days.

(21) Appl. No.: 14/890,927

(22) PCT Filed: May 15, 2014

(86) PCT No.: PCT/US2014/038153
§ 371 (c)(1),
(2) Date: Nov. 13, 2015

(87) PCT Pub. No.: WO2014/186551
PCT Pub. Date: Nov. 20, 2014

(65) Prior Publication Data
US 2016/0101452 A1   Apr. 14, 2016

Related U.S. Application Data

(60) Provisional application No. 61/823,572, filed on May 15, 2013.

(51) Int. Cl.
*B21C 25/02* (2006.01)
*B21C 23/08* (2006.01)
(Continued)

(52) U.S. Cl.
CPC .......... *B21C 25/025* (2013.01); *B21C 23/085* (2013.01); *B23P 15/24* (2013.01);
(Continued)

(58) Field of Classification Search
CPC ..... B21C 25/02; B21C 25/025; B21C 23/085; B21C 25/10; B23P 15/24; B23P 15/246; C23C 16/14
See application file for complete search history.

(56) References Cited

U.S. PATENT DOCUMENTS 8,191,393 B2   6/2012   Kraft
2008/0124423 A1*   5/2008   Peterson ............... B23P 15/243
425/467

(Continued)

FOREIGN PATENT DOCUMENTS

DE   3221388 A1   12/1983
DE   3431892 A1   3/1986

OTHER PUBLICATIONS

International Search Report and Written Opinion From Corresponding PCT Appln PCT/US2014/038153 dated Dec. 9, 2014 (14 pages).

*Primary Examiner* — Debra Sullivan
(74) *Attorney, Agent, or Firm* — Wood Herron & Evans LLP

(57) ABSTRACT

A hot extrusion die tool and a method of making the hot extrusion die tool are provided. The hot extrusion die tool includes a die tool component including a nickel-based super alloy; and a wear resistant coating deposited on the die tooling component. The method of making the hot extrusion die tool includes coating at least one portion of an extrusion die tool component comprising a nickel-based super alloy with a wear resistant coating at a high temperature; and hardening the extrusion die tool component and the at least one coated portion.

12 Claims, 3 Drawing Sheets

(51) Int. Cl.
*C23C 28/04* (2006.01)
*B23P 15/24* (2006.01)
*C21D 1/06* (2006.01)
*C21D 1/58* (2006.01)
*C21D 1/613* (2006.01)
*C21D 1/773* (2006.01)
*C22C 19/05* (2006.01)
*C22F 1/10* (2006.01)
*C23C 16/06* (2006.01)

(52) U.S. Cl.
CPC ................ *C21D 1/06* (2013.01); *C21D 1/58* (2013.01); *C21D 1/613* (2013.01); *C21D 1/773* (2013.01); *C22C 19/056* (2013.01); *C22F 1/10* (2013.01); *C23C 16/06* (2013.01); *C23C 28/04* (2013.01); *C23C 28/042* (2013.01); *C23C 28/044* (2013.01)

(56) References Cited

U.S. PATENT DOCUMENTS

| | | | |
|---|---|---|---|
| 2008/0261058 A1* | 10/2008 | Layyous | C23C 30/005 428/450 |
| 2010/0064756 A1* | 3/2010 | Kraft | B21C 23/085 72/261 |
| 2010/0199738 A1* | 8/2010 | Nolting | B21C 25/00 72/264 |
| 2017/0165759 A1* | 6/2017 | Jiang | B23B 27/148 |

* cited by examiner

HOT EXTRUSION DIE TOOL AND METHOD OF MAKING SAME

PRIORITY CLAIM

This application is a submission under 35 USC § 371 of International Application No. PCT/US2014/038153, filed May 15, 2014, which claims priority to U.S. Provisional Patent Application Ser. No. 61/823,572, filed on May 15, 2013, the disclosures of which are expressly incorporated by reference herein in their entirety.

FIELD OF INVENTION

The present invention relates to hot extrusion die tools and methods of making hot extrusion die tools having improved wear resistance.

BACKGROUND

Multi-channel copper tubing provides the air conditioning and refrigeration industries with a product to create high efficiency heat exchangers. Copper multi-channel tubing offers higher strength and improved thermal conductivity relative to typical aluminum tubing. Copper exhibits anti-microbial properties and superior corrosion resistance, which are desirable in a variety of applications. Such copper tubing can also be easily soldered or brazed and this adds to the ease of heat exchanger construction and repair.

Copper's relatively higher strength is an advantage when it comes to the finished product, but this property also makes it difficult to extrude. During the extrusion operation, the container and die are generally heated to approximately 750° C.-800° C. At 750° C. copper has a flow stress of about 43 MPa at a strain rate of 1 $s^{-1}$. Accordingly, in high temperature metal forming processes, tooling, such as dies, must have good strength and wear resistance. Hot-work tools steels (e.g., H10, H11, H12, and/or H13) only provide acceptable strength up to about 500° C. In temperatures exceeding 500° C., e.g., greater than 500° C. to about 800° C., metals classified as super alloys demonstrate superior strength compared to tool steels. These super alloys are heat treated to achieve acceptable strengths. Copper extrusion tooling is constructed from commercial super alloys, such as Rene 41, Inconel 718, and ATI 720, due to their favorable strength properties.

However, hot extrusion tooling constructed from super alloys still undergo substantial wear at the elevated temperatures and flow stresses experienced during hot extrusion of copper and/or copper alloys, especially when forming micro-channel tubing. One solution to address the excessive wearing of hot extrusion die assembly components may be to use components constructed of an alloy steel, a super alloy, or other suitable material having a wear resistant coating, such as a hard thin-film of $Al_2O_3$, which can be deposited by chemical vapor deposition (CVD), such as that generally disclosed in U.S. Pat. No. 8,191,393, the entirety of which is incorporated herein by reference. However, the CVD coating processing conditions generally degrade the strength and hardness of the base material. Accordingly, subsequent heat treatment step(s) is/are required to restore the desired strength and hardness properties of the base material.

One problem encountered in the heat treatment or hardening process is the loss of adhesion of the wear resistant coating material. Heat treatment for super alloys includes a sequential process of solutionizing, quenching, and aging, which serve to strengthen and harden the super alloy. Solutionizing involves heating the super alloy above its solvus temperature to dissolve soluble intermetallic phases into a solid solution. The material is then quenched to make a supersaturated solid solution, which is followed by heating for a specified duration at a sub-solvus temperature to age the material and produce fine precipitates of intermetallic phases to strengthen and harden the alloy. Following conventional or standard solutionizing conditions for super alloys, delamination of the wear resistant coating was observed during the quenching step.

In view of the foregoing, there is a need for new hot extrusion die tools having wear resistant coatings, as well as viable methods of preparing these coated hot extrusion die tools.

SUMMARY OF THE INVENTION

The present invention is premised on the realization that hot extrusion die tools having improved wear resistance can be achieved by applying a wear resistant coating material thereto, followed by an appropriate heat treatment protocol to achieve high tooling strength, while maintaining satisfactory coating adhesion.

According to one embodiment of the present invention, an extrusion die tool is provided, comprising a die tool component comprising a nickel-based super alloy; and a wear resistant coating deposited on the die tooling component.

According to another embodiment of the present invention, there is provided a method for making an extrusion die tool, the method comprising the steps of coating at least one portion of an extrusion die tool component comprising a nickel-based super alloy with a wear resistant coating at a high temperature; and hardening the extrusion die tool component and the at least one coated portion.

The invention will be further appreciated in light of the following detailed description and drawings.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION

Figure 1:
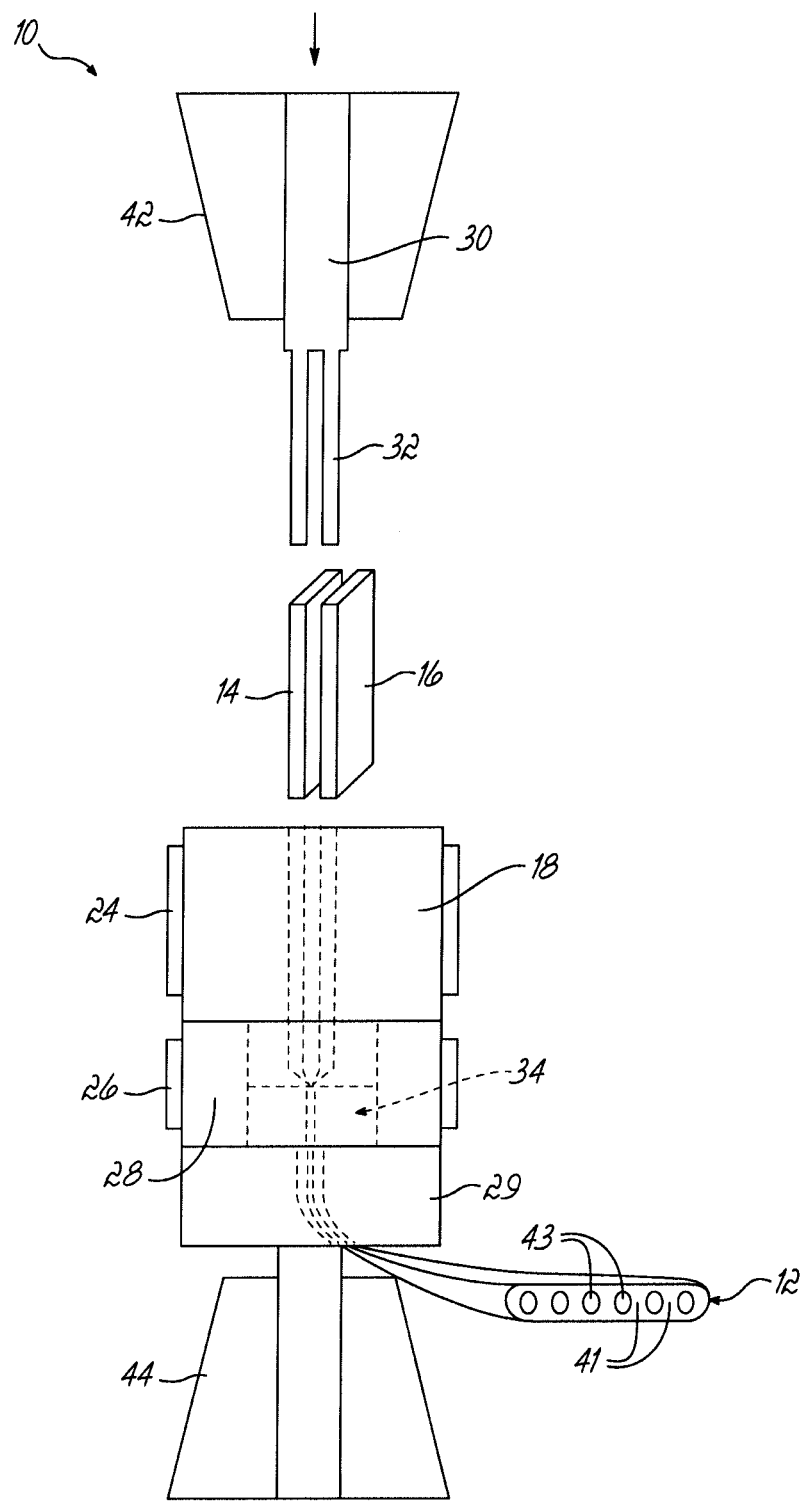
FIG. 1 is a schematic representation showing a hot extrusion apparatus for producing micro-channel tubes extruded from a non-aluminum metal or alloy, in accordance with embodiment of the present invention.

In one exemplary embodiment shown in FIG. 1, an apparatus 10 for producing a multi-channel tube 12 from a metal or alloy, using a modified hot extrusion process, is provided. In one exemplary embodiment, the metal or alloy is a non-aluminum metal or alloy, such as copper or a copper alloy. The metal or alloy may be any alloy that is extruded at temperatures up to approximately 800° C. and is otherwise difficult to extrude (e.g., UNS C10100, which is an oxygen-free electronic copper, or C12200, which is deoxidized high phosphorus (DHP) copper). The apparatus 10 is operable to extrude two rectangular (in cross-section) billets 14, 16 in parallel, simultaneously through a two-chamber container 18 of the apparatus 10. In one exemplary embodiment, the billets 14, 16 are solid and formed, for example, from a hard non-aluminum alloy. A top billet 14 and a bottom billet 16 are extruded through a die assembly 34, wherein at least one of its components is coated with a wear resistant coating, and the corresponding extrudates combine to form the multi-channel tube 12.

During operation, the billets 14, 16 are forced into a deformation zone of the die assembly 34. Accordingly, the billets 14, 16 form two separate flow streams, such that each billet 14, 16 produces approximately one-half of the multi-channel tube 12. At the point where the two separate extrudate flow streams come together, solid state welds are formed to provide the multi-channel tube 12.

In further reference to FIG. 1, initially, the two billets 14, 16 are heated to an appropriate temperature (e.g., about 700° C. to about 800° C.) for the extrusion of the multi-channel tube 12. For copper and copper alloy extrusion, an exemplary temperature range is about 550° C. to about 1000° C. A general approximation of a suitable extrusion temperature range for a metal or an alloy would be about 60% of the absolute melting temperature of the metal or the alloy. The billets 14, 16 can be heated using any suitable means, such as a furnace or induction heater. Thereafter, a fixture (not shown) transfers the billets 14, 16 for loading into the pre-heated two-chamber container 18. As shown in FIG. 1, in some embodiments, the apparatus 10 includes heaters 24 and 26 to pre-heat the container 18 and maintain an elevated temperature, thereby facilitating the extrusion of the multi-channel tube 12.

While the extrusion process may take place at approximately 800° C., alternate temperature values can range from about 550° C. to about 1000° C. or 60% of the absolute melting temperature of the metal or alloy being extruded, tooling pre-heat temperatures can be significantly lower, such as around 500° C., or up to (just below) the melt temperature of the billets 14, 16. By way of example, the container 18 and a die holder 28 may be heated with band or cartridge heaters (as heaters 24, 26), and digital temperature controllers (not shown) may be used to maintain their temperatures at a desired level (e.g., 500° C. or higher).

According to the embodiment shown in FIG. 1, a ram 30 includes a dual stem 32 that applies pressure to the billets 14, 16 and pushes them into the container 18. The mode of operation may be ram (stroke) control, wherein a velocity of the ram 30 or its position is specified or controlled with respect to time. The dual stem 32 is able to simultaneously provide pressure to each of the billets 14, 16. Under this pressure, the billets 14, 16 are deformed into a die assembly 34 of the apparatus 10. The apparatus 10 may further include the die holder 28 and other supporting structure 29 (e.g., a backer, a bolster and a platen), which provide the necessary support for the die assembly 34 and the extruded multi-channel tube 12 during the extrusion process.

Figure 2:
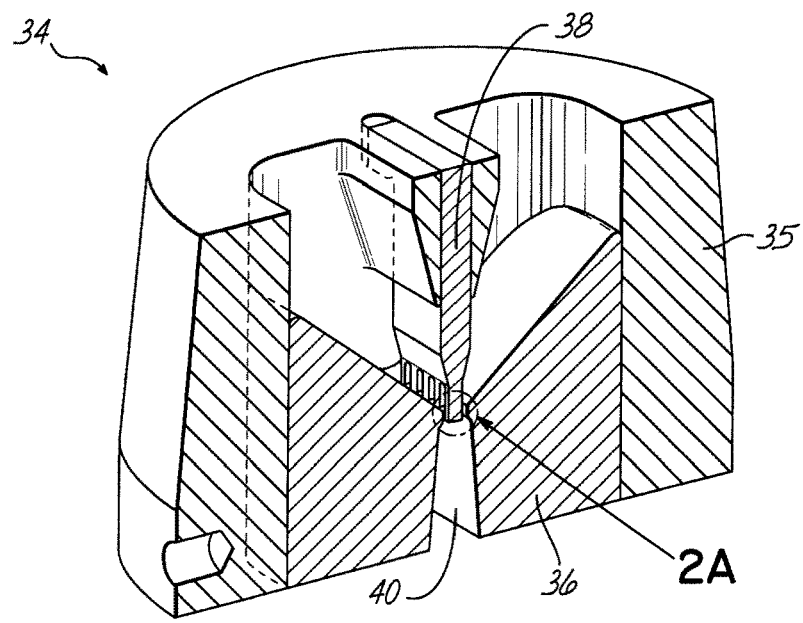
FIG. 2 is a cross-sectional perspective view of a coated extrusion die tool, in accordance with an embodiment of the present invention.

An embodiment of the die assembly 34 is shown in FIG. 2. The die assembly 34 includes a die body 35, a plate 36, and a mandrel 38 extending into an opening 40 in the plate 36. As a result of the applied heat and pressure, the softened metal or alloy of the billets 14, 16 is squeezed in the die assembly 34. As the billets 14, 16 deform in the die assembly 34, new "clean" un-oxidized surface area is generated in extrudate flow streams. Thereafter, these clean metal surfaces of the two metal streams corresponding to the two extruded billets 14, 16 are forced together to produce solid-state welds, thereby forming continuous internal walls 41 of the multi-channel tube 12, thereby forming channels 43, as depicted in FIG. 1.

In one exemplary embodiment, the apparatus 10 interfaces with or otherwise incorporates a machine, such as a servo-hydraulic extrusion press machine (an MTS® Systems Corporation machine having a 250 kN/56,000 lb. load capacity was used for process development), to provide the extrusion force to the apparatus 10. The press machine includes an assembly 42 that holds the ram 30, wherein the press machine can drive the dual stem 32 of the ram 30 against the billets 14, 16 to force the billets 14, 16 into the container 18 and through the die assembly 34. The press machine can also include a grip assembly 44 for supporting the remaining portions of the apparatus 10 (e.g., the dual-chamber container 18, the die holder 28, and the die assembly 34). Heat exchangers/coolers (not shown) can be used to isolate the heat generated by the apparatus 10 from the press machine.

As the multi-channel tube 12 exits the apparatus 10, it can be air, inert gas, or water cooled. In one exemplary embodiment, the multi-channel tube 12 has a length of approximately 640 mm from 50 mm of extruded billet (from process development efforts). One of ordinary skill in the art will appreciate that a length of the extruded multi-channel tube 12 can be varied by selecting appropriately sized billets and/or continuing to weld or fuse additional billets to the initial billets as the initial billets are consumed during the extrusion process. Provisions can be made, as known in the art, to safely handle the hot multi-channel tube 12 as it exits the apparatus 10.

In accordance with embodiments of the present invention, one or more of the components of the die assembly 34 is formed of a super alloy or other similar material that coated with a hard thin-film coating deposited by chemical vapor deposition (CVD) or physical vapor deposition (PVD) to provide improved wear characteristics. As used herein, "super alloy or other similar material" includes high strength nickel-based alloys, which include but are not limited to Nickel alloy 41, Nickel alloy 718, and Nickel alloy 720. For example, Rene 41™, Inconel® 718, and ATI 720™ are commercially available nickel-based alloys. A comparison of the relative amounts of Ni, Cr, Co, Fe, Al, C, Ti, Mo, V, W, and Nb for Rene 41™, Inconel® 718, and ATI 720™ versus a common hot work tool steel (i.e., H13) is shown in Table 1.

TABLE 1

Nominal compositions of AISI H13 steel and
Ni-based super alloys Rene 41 ™, Inconel ® 718,
and ATI 720 ™.

| | Alloy | | | |
|---|---|---|---|---|
| Element | H13 | ATI 720 ™ | Rene 41 ™ | Inconel ® 718 |
| Ni | 0 | 55% | 53% | 54% |
| Cr | 5.2% | 18% | 19% | 19% |
| Co | 0 | 14.7% | 11% | <1% |
| Fe | Balance | 0 | 0 | 17% |
| Al | 0 | 2.5% | 1.6% | 0.5% |
| C | 0.36% | 0 | 0 | 0 |

TABLE 1-continued

Nominal compositions of AISI H13 steel and
Ni-based super alloys Rene 41 ™, Inconel ® 718,
and ATI 720 ™.

| | Alloy | | | |
|---|---|---|---|---|
| Element | H13 | ATI 720 ™ | Rene 41 ™ | Inconel ® 718 |
| Ti | 0 | 5% | 3.2% | 0.9% |
| Mo | 1.4% | 3% | 9.7% | 3.1% |
| V | 1% | 0 | 0 | 0 |
| W | 0 | 1.25% | 0 | 0 |
| Nb | 0 | 0 | 0 | 5.2% |

The strength of the superalloys makes them a favorable choice for the tooling material and has been utilized for components of the multi-channel copper extrusion dies of embodiments of the present invention. In one embodiment, the extrusion die component comprises a Ni-based super alloy, such as Nickel alloy 41, Nickel alloy 718, Nickel alloy 720, or other alloys with a comparable or similar composition. Non-limiting examples of suitable Ni-based alloys include those comprising about 53% to about 55% Ni; about 18% to about 19% Cr; about 1% to about 15% Co; about 0% to about 17% Fe; about 0.5% to about 2.5% Al; about 0.9% to about 5% Ti; about 3% to about 10% Mo; about 0% to about 1.25% W; and about 0% to about 5.2% Nb. For example, the Ni-based alloy may comprise about 55% Ni; about 18% Cr; about 15% Co; about 2.5% Al; about 5% Ti; about 3% Mo; and about 1.25% W. In another example, the Ni-based alloy may comprise about 53% Ni; about 19% Cr; about 11% Co; about 1.6% Al; about 3.2% Ti; and about 9.7% Mo. And in yet another embodiment, the Ni-based alloy may comprise about 54% Ni; about 19% Cr; less than 1% Co; about 17% Fe; about 0.5% Al; about 0.9% Ti; about 3.1% Mo; and about 5.2% Nb.

In one exemplary embodiment, the plate 36 and the mandrel 38 components, which are critical wear components of the die assembly 34, are each independently made from a super alloy. In another embodiment, the die body 35 is also made from a super alloy.

Most wear is expected on the plate 36 and the mandrel 38 of the die assembly 34, and more specifically on the bearing surfaces of these components. The bearing surfaces are the regions adjacent to where the tube exits the die, and they establish the dimensions and surface finish of the product. The loss of material from the bearing surfaces of the plate 36 and the mandrel 38 can change the size, shape, and surface finish of the extruded product. Accordingly, reducing wear at these locations is preferable to minimize tooling replacement, which thereby reduces the overall extrusion costs.

Adhesive and abrasive wear are the two most commonly observed forms of wear in hot extrusion processes. Accordingly, surface treatments can be applied to the surfaces of the plate 36 and/or the mandrel 38 to create a harder bearing surface, which makes it more difficult for the extrusion material to adhere. Thus, in another exemplary embodiment, the critical wear components of the die assembly 34 (i.e., the plate 36 and the mandrel 38) are made from a super alloy and at least one, if not both, is further coated with a wear resistant coating, which is deposited by CVD and has a service temperature of approximately 800° C.

Figure 3:
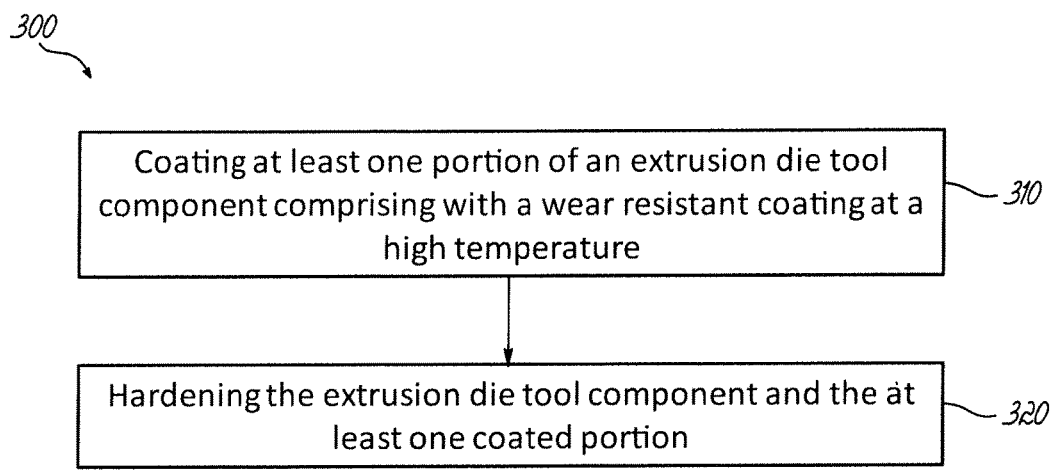
FIG. 3 is a flow chart for illustrating a method of making a coated extrusion die tool component, in accordance with an embodiment of the present invention.

As shown in FIG. 3, in accordance with another embodiment of the present invention, a method (300) of making an extrusion die tool is provided. The method comprises the steps of: coating at least one portion of an extrusion die tool component from a nickel-based superalloy with a wear resistant coating at a high temperature (Step 310); and hardening the extrusion die tool component and the at least one coated portion (Step 320). Accordingly, the desired components of the die assembly 34 may be coated with a wear resistant coating using known CVD coating processes at high temperatures that, by virtue of the high temperatures (i.e., temperatures that fall in the range of about 900° C. to about 1050° C.) at which they are conducted, degrades the strength and hardness of the base metal. As such, the coated extrusion die tool component requires exposure to a subsequent heat treatment or hardening process.

The CVD wear resistant coating may be prepared from a coating material selected from the group containing titanium and/or aluminum, and the coating is applied in a CVD process to the surface of the desired portions of the extrusion die tool. Thermally-activated CVD is known in the art for the production of single crystals, the impregnation of fiber structures with carbon or ceramics, and generally for the deposition of thin layers, either by growth onto a surface or by the diffusion of borides, carbides, nitrides, and/or oxides. By virtue of the aforementioned coating and thermally-activated CVD coating step, a wear-resistant layer is provided for the coated portions of the extrusion die tool, which uniformly, regularly, and adhesively covers the coated portions. While the entire extrusion die tool itself can be coated, it may be more cost-effective to coat only certain portions of the die tool. For example, as mentioned above and shown in FIG. 2A, only the bearing surfaces of the mandrel 36 and the plate 38 may be coated. While this exemplary method uses a CVD coating process, any number of coating processes can be used, so long as chemical bond is formed between the wear coating material and the bearing surface of the die tool component.

Figure 2A:
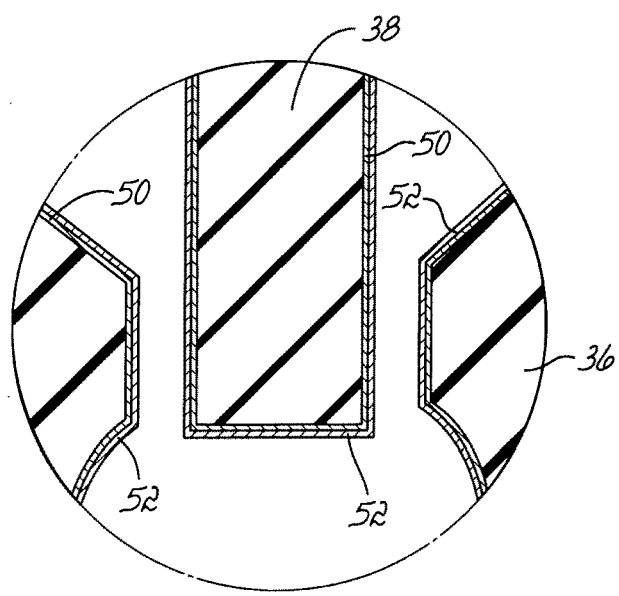
FIG. 2A is a magnified cross-sectional view of a portion of the coated extrusion die tool shown in FIG. 2, in accordance with an embodiment of the present invention.

According to embodiments of the present invention, the wear resistant coating comprises at least one of aluminum or titanium. In another embodiment, the wear resistant coating comprises aluminum and titanium, which may be in a bi-layer. For example, the wear resistant coating may include one or more layers of TiCN and one or more layers of $Al_2O_3$. Accordingly, in one embodiment, the TiCN layer(s) 50 can be first applied to the surface of the die tool component (e.g., plate 36 and/or mandrel 38) and then overcoated with the $Al_2O_3$ layer(s) 52, as shown in FIG. 2A.

In one embodiment, Bernex™ 29 CVD wear resistant coating was applied using a Bernex™ BPXpro series CVD coating system by Ionbond® (Madison Heights, Mich.), which provides a service temperature up to 1000° C. The wear resistant coating comprises a TiCN sub-layer and an $Al_2O_3$ top layer, which was deposited at a deposition temperature in a range from about 900° C. to about 1050° C. Typical thicknesses for the Bernex™ 29 CVD wear resistant coating is about 6 microns to about 14 microns, with the $Al_2O_3$ layer being about 3 microns to about 5 microns, and the TiCN layer being about 6 microns to about 9 microns.

Figure 4:
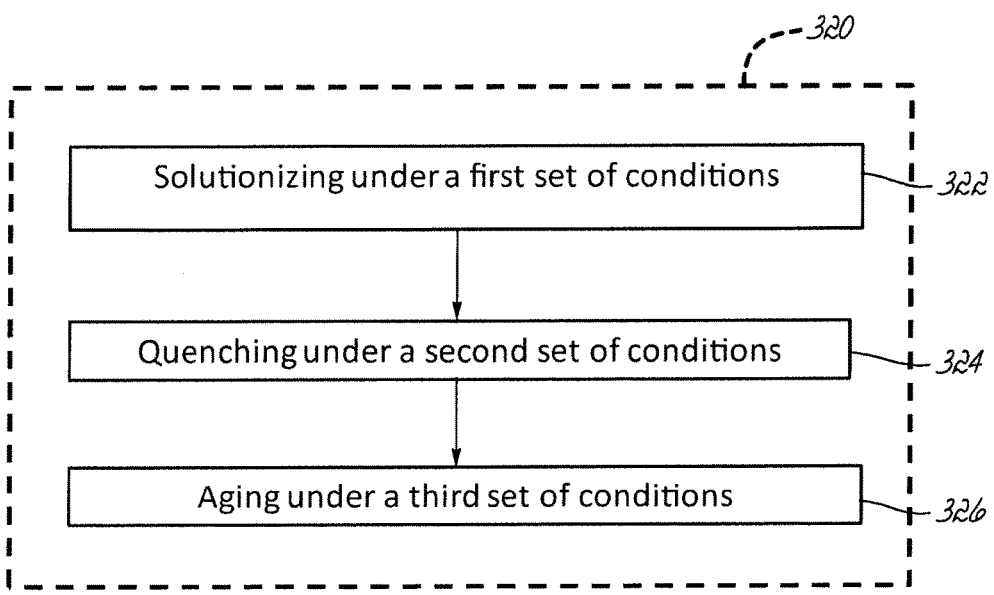
FIG. 4 is a flow chart for illustrating a process for hardening the coated extrusion die tool component, in accordance with an embodiment of the method shown in FIG. 3.

As previously noted above, the elevated deposition temperature of the CVD process degrades the strength and hardness of the base super alloy material. Accordingly, subsequent heat treatment step(s) is/are required to restore the desired strength and hardness properties of the base material. In reference to FIGS. 3 and 4, the coated extrusion die tool component is then subjected to a heat treatment or hardening step. Accordingly, hardening the extrusion die tool component and the at least one coated portion (Step 320) comprises: solutionizing under a first set of conditions (Step 322); quenching under a second set of conditions (Step 324); and aging under a third set of conditions (Step 326).

As noted above, it was observed that during conventional heat treatments, the Bernex™ 29 CVD wear resistant coating that had been applied to ATI 720™, Inconel® 718, and Rene 41™ substrates delaminated. Thus, modified heat treatments steps were discovered that retained the wear coating adhered to the Ni-based super alloy substrate. The coated samples, after being subjected to the modified heat treatment process, were tested for hardness, friction coefficient, and wear rate (as described in more detail below) and compared to the non-coated control. The non-coated control was processed using the conventional heat treatment process for the specified Ni-based super alloy. The results of the comparative study are shown in Tables 2-4 below.

conditions include heating the coated die tool component at about 1025° C. for about 30 minutes at about −20 inHg vacuum. The second set of conditions include cooling the coated die tool component by applying about 40 pounds per square inch (psi) nitrogen until the coated die tool component is at about room temperature. And the third set of conditions include heating the coated die tool component at about 650° C. for about 24 hours under about 6 psi nitrogen atmosphere, cooling the coated die tool component to about room temperature by applying about 6 psi nitrogen, heating the coated die tool component at about 760° C. for about 16 hours under about 6 psi nitrogen atmosphere, and cooling

TABLE 2

ATI 720 ™ comparison of conventional and modified heat treatment processes.
ATI 720

| | Heat Treatment | | | | Friction | |
|---|---|---|---|---|---|---|
| | Solutionizing | Quench | Aging | Hardness | Coefficient | Wear Rate |
| Non-Coated | 4 hrs @ 1080° C. | 40 psi Nitrogen | 24 hrs @ 650° C. air cool 16 hrs @ 760° C. air cool | 46 HRC | 0.415 | 3.96E−6 mm$^3$/Nm |
| Coated | 30 min @ 1025° C. in −20 in Hg vacuum | 40 psi Nitrogen | nitrogen atmosphere 24 Hrs @ 650° C. 6 psi nitrogen cool 16 hrs @ 760° C. 6 psi nitrogen cool | 41 HRC | 0.48 | 1.85E−6 mm$^3$/Nm |

TABLE 3

Inconel ® 718 comparison of conventional and modified heat treatment processes.
Inconel 718

| | Heat Treatment | | | | Friction | |
|---|---|---|---|---|---|---|
| | Solutionizing | Quench | Aging | Hardness | Coefficient | Wear Rate |
| Non-Coated | 1 hr @ 978° C. | Air Cool | 8 hrs @ 718° C. cool at 56° C./hr to 621° C. hold for 8 hrs air cool | 44 HRC | 0.426 | 2.82E−5 mm$^3$/Nm |
| Coated | 1 hr @ 978° C. in −20 in Hg vacuum | 6 psi Nitrogen | nitrogen atmosphere 8 hrs @ 718° C. cooled at 56° C./hr to 621° C. held for 8 hrs 6 psi nitrogen cool | 38 HRC | 0.483 | 5.17E−6 mm$^3$/Nm |

TABLE 4

Rene 41 ™ comparison of conventional and modified heat treatment processes.
Rene 41

| | Heat Treatment | | | | Friction | |
|---|---|---|---|---|---|---|
| | Solutionizing | Quench | Aging | Hardness | Coefficient | Wear Rate |
| Non-Coated | 4 hr @ 1080° C. | Air Cool | 16 hrs @ 760° C. air cool | 43 HRC | 0.33 | 9.75E−6 mm$^3$/Nm |
| Coated | 1 hr @ 1080° C. in −20 in Hg vacuum | 6 psi Nitrogen | nitrogen atmosphere 16 hrs @ 760° C. 6 psi nitrogen cool | 38 HRC | 0.468 | 4.66E−6 mm$^3$/Nm |

Thus as provided in Table 2, in accordance with an embodiment of the present invention, a method of hardening or heat treating a wear resistant coated substrate comprising Nickel alloy 720 includes solutionizing under a first set of conditions; quenching under a second set of conditions; and aging under a third set of conditions. The first set of the coated die tool component to room temperature by applying about 6 psi nitrogen.

Thus as provided in Table 3, in accordance with another embodiment of the present invention, a method of hardening or heat treating a wear resistant coated substrate comprising Nickel alloy 718 includes solutionizing under a first set of conditions; quenching under a second set of conditions; and aging under a third set of conditions. The first set of conditions include heating the coated die tool component at about 978° C. for about 1 hour at about −20 inHg vacuum. The second set of conditions includes cooling the coated die tool component to about room temperature by applying about 6 psi nitrogen. And the third set of conditions include heating the coated die tool component at about 718° C. for about 8 hours under a nitrogen atmosphere, cooling at the coated die component at about 56° C./hr to about 621° C. under about 6 psi nitrogen, maintaining the coated die tool component at about 621° C. for about 8 hours under the nitrogen atmosphere, and cooling the coated die component to room temperature under about 6 psi nitrogen.

Thus as provided in Table 4, in accordance with another embodiment of the present invention, a method of hardening or heat treating a wear resistant coated substrate comprising Nickel alloy 41 includes solutionizing under a first set of conditions; quenching under a second set of conditions; and aging under a third set of conditions. The first set of conditions include heating the coated die tool component at about 1080° C. for about 1 hour at about −20 inHg vacuum. The second set of conditions includes cooling the coated die tool component to about room temperature by applying about 6 psi nitrogen. The third set of conditions include heating the coated die tool component at about 760° C. for about 16 hours under a nitrogen atmosphere, and cooling the coated die component to room temperature under about 6 PSI nitrogen.

The present invention will be further appreciated in view of the following examples.

EXAMPLES

Example 1: Preliminary ATI 720™ Trials

Initial testing was conducted to determine the feasibility of coating the superalloys with a standard CVD coating. Round disc samples 30 mm in diameter and 5 mm thick were cut from ATI 720™. The four samples were polished with 180 grit SiC paper on a Leco polishing machine. This was followed by 320 and 600 grit SiC paper. Finally the samples were polished using 9 micron diamond followed by 1 micron diamond to obtain a sample surface finish of 1 micron. Table 5 shows the average surface roughness of the samples post polishing. Surface roughness data were averaged over three measured roughness values.

TABLE 5

ATI 720 ™ average surface roughness data post polishing for the preliminary samples.
ATI 720

| Sample | Side | Average Surface Roughness (Ra, 0.1" stroke) |
|---|---|---|
| 1 | A | 0.18 μm |
|   | B | 0.19 μm |
| 2 | A | 0.05 μm |
|   | B | 0.04 μm |
| 3 | A | 0.12 μm |
|   | B | 0.09 μm |
| 4 | A | 0.13 μm |
|   | B | 0.28 μm |

These ATI 720™ samples were coated by Ionbond with the Bernex™ 29 chemical vapor deposition coating. This TiCN/Al$_2$O$_3$ coating offers a service temperature of 1000° C. and has a thickness of about 6 to about 12 microns. The coating includes two layers TiCN sub-layer and an Al$_2$O$_3$ top layer. The deposition temperature of the coating was between 900° C. and 1050° C.

To restore the heat-treated strength lost during the coating process, the samples were re-heat-treated with the standard cycle for this alloy. Two samples were placed in a furnace at 1090° C. for 4 hours, for the solutionizing treatment. The samples were then immediately quenched in oil. During this process some of the coating disappeared from the surface of the samples. An evaluation of the samples led to an assertion that adhesion of the Al$_2$O$_3$ layer was lost due to the rapid cooling in the oil quench.

A study was performed to determine the effect of substituting a "slower" air quench for the oil quench in the solutionizing heat treatment. This was done to determine if air quenching could still give similar strength properties to the material. The slower cooling rate was thought to be desired to retain coating adhesion to the super alloy.

Two samples of ATI 720™ were heated in a furnace at 1080° C. for 4 hours. After the 4 hours, the first sample was quenched in oil by submerging it in the oil and swirling it. This was done for 1 minute, the second sample was then removed from the furnace and air quenched by blowing compressed air at 40 psi over the sample. The sample was held in this location for 3 minutes. The hardness of each sample was measured to indicate solution-treated strength. The samples were then given the standard 2-step aging heat treatment cycle of 650° C. for 24 hours, and then 760° C. for 16 hours. After each treatment, the samples were removed from the furnace, allowed to air cool and were hardness tested. Table 6 shows a comparison of the average hardness of the samples between the oil and air quench. Values were an average of three measurements.

TABLE 6

Comparison of oil vs. air quench hardness.

|  | Oil Quench | Air Quench |
|---|---|---|
| Hardness Avg. after Solutionizing (HRC) | 40.7 | 39.0 |
| Hardness Avg. after First Age (HRC) | 42.0 | 41.3 |
| Hardness Avg. after Second Age (HRC) | 43.2 | 42.7 |

This study indicated that it is possible to air quench the ATI 720™ samples and maintain the hardness of the material. This is believed to be possible due to the relatively small size of the samples. The quench rate can be slower because the heat can be removed from material more quickly, "locking it" into a solid solution, because of the small size and mass of the sample. With large samples the cooling rate must be faster to allow the material to cool quickly enough to stop the process in the core of the sample.

The next test was to determine if an air or gas quench would allow the CVD coating to remain adhered to samples during heat treating. Two CVD coated samples of ATI 720™ were sent to Sturm Steel (Indianapolis, Ind.) to undergo the solutionizing and quenching steps of the heat treating cycle.

The standard temperature, 1080° C., and time, 4 hrs, for the solutionizing step of ATI 720™ was used and performed in a vacuum furnace. The samples were quenched using a 3 bar nitrogen quench. This procedure caused the coating to delaminate.

Furnace Design and Fabrication: A Lindberg tube furnace was modified such that samples could be heat treated in vacuum and quenched with nitrogen gas in a cool zone. This furnace has a 3 foot heating area divided into three zones each with its own controller. A quartz tube 5 feet long with a 3 inch outside diameter was added as the heat treating chamber. End caps were designed and fabricated to contain the atmosphere within the furnace. End cap plates were constructed from aluminum, which are held in place by four bolts "hose-clamped" to the tube with wing nuts. This allows for quick removal of the end caps for loading and unloading of samples from the tube. A high-temperature silicone rubber gasket was placed between the tube and end cap to make the tube airtight. Swagelok connectors were inserted into the right end cap for the vacuum pump and nitrogen line connections. An aluminum bracket was also fabricated and attached to the furnace stand to hold the valves and gauge to control the vacuum and nitrogen flow. This plate is adjustable to allow easy removal of the end cap without disconnecting lines for loading the furnace.

The left end-cap has an Omega Engineering thermocouple and push/pull rod pass-through. The push/pull rod pass-through was fabricated using aluminum and a Viton® fluoroelastomer o-ring. The push/pull rod is a ⅛ inch diameter stainless steel rod that is attached to a 2 inch square ceramic plate. The plate acts as the carrier for the samples and allows the samples to be moved to the heating and quenching zones of the tube furnace.

The right side of the furnace tube is the cooling zone. Copper tubing is wrapped around the quartz tube to provide water cooling to this region. Cold water passes through these tubes during the heat treating procedure.

Examples 2-5: Coated D2, ATI 720™, Rene 41™ and Inconel® 718 Samples

Sample Preparation: The preliminary trials showed that it was feasible to coat nickel-based super alloys with a multi-layer TiCN/Al$_2$O$_3$ CVD coating. To further explore facilitating complete adhesion of the coating with a post-coating heat treatment, the following experiments were conducted.

Four samples of each superalloy, ATI 720™, Rene 41™ and Inconel® 718 were prepared for coating and wear testing via the procedure presented in this section. In addition, three AISI D2 tool steel samples were prepared as control samples for simultaneous coating with the superalloys. D2 steel is a common high-carbon, high chromium cold work tool steel that has been successfully coated with the Bernex™ 29 TiCN/Al$_2$O$_3$ coating and subsequently re-heat treated to achieve final material strength and hardness. Accordingly, the purpose of the D2 steel control sample was to ensure that proper coating adhesion for a known alloy/coating combination was achieved. All samples were small discs with a 30-40 mm diameter and 5-7 mm thickness.

After the sample discs were machined, an initial complete heat treatment was performed on the samples using the standard heat treatment cycles for each respective material. A pre-heat treatment of the material being coated is the standard recommended practice when applying a CVD coating. When the substrate material is heat treated before applying the coating, it reduces the amount of distortion that can occur in the tooling. Table 7 shows the standard heat treatment cycles for D2 tool steel, ATI 720™, Rene 41™, and Inconel® 718. The hardness values, which were averaged over 6 measurements, for the samples after undergoing there standard heat treatment cycles are shown in Table 8.

TABLE 7

Standard heat treatment cycles for the test materials.
Standard Heat Treatment

| | Austenitizing or Solutionizing | Quench | Tempering or Aging |
|---|---|---|---|
| D2 | 30 min @ 1025° C. | 40 psi Nitrogen to 65° C. | (2X) 2 hrs @ 500° C. air cool |
| ATI 720 | 4 hrs @ 1080° C. | Oil | 24 hrs @ 650° C. air cool 16 hrs @ 760° C. air cool |
| Inconel 718 | 1 hr @ 978° C. | Air Cool | 8 hrs @ 718° C. cool at 56° C./hr to 621° C. hold for 8 hrs air cool |
| Rene 41 | 4 hrs @ 1080° C. | Air Cool | 16 hrs @ 760° C. air cool |

TABLE 8

Sample hardness after undergoing their respective standard heat treatment cycles.
Sample Hardness

| Material | Trial | Hardness (HRC) |
|---|---|---|
| ATI 720 | 1 | 46 |
| | 2 | 46 |
| | 3 | 46 |
| Rene 41 | 1 | 43 |
| | 2 | 44 |
| | 3 | 43 |
| Inconel 718 | 1 | 44 |
| | 2 | 44 |
| | 3 | 44 |
| D2 | 1 | 54 |
| | 2 | 54 |
| | 3 | 53 |

The samples were then polished to a 1 micron surface finish with a Leco polishing machine. The polishing sequence included wet grinding with 180, 320 and 600 SiC paper, and then polishing with 9 μm and 1 μm diamond media. Table 10 shows the average surface roughness values for the polished samples. The surface roughness values were averaged over 3 measurements.

TABLE 10

Surface roughness of samples after a 1 μm diamond media polish.
Sample Surface Roughness

| Material | Trial | Side | Average Surface Roughness (Ra, 0.1" stroke) |
|---|---|---|---|
| ATI 720 | 1 | A | 0.08 μm |
| | | B | 0.27 μm |
| | 2 | A | 0.11 μm |
| | | B | 0.07 μm |
| | 3 | A | 0.05 μm |
| | | B | 0.05 μm |
| Rene 41 | 1 | A | 0.07 μm |
| | | B | 0.05 μm |
| | 2 | A | 0.05 μm |
| | | B | 0.08 μm |
| | 3 | A | 0.05 μm |
| | | B | 0.05 μm |
| Inconel 718 | 1 | A | 0.09 μm |
| | | B | 0.08 μm |
| | 2 | A | 0.09 μm |
| | | B | 0.09 μm |
| | 3 | A | 0.33 μm |
| | | B | 0.15 μm |
| D2 | 1 | A | 0.04 μm |
| | | B | 0.19 μm |

TABLE 10-continued

Surface roughness of samples after a 1 μm diamond media polish.
Sample Surface Roughness

| Material | Trial | Side | Average Surface Roughness (Ra, 0.1" stroke) |
|---|---|---|---|
| | 2 | A | 0.05 μm |
| | | B | 0.04 μm |
| | 3 | A | 0.05 μm |
| | | B | 0.03 μm |

Three polished samples of each alloy were sent to Ionbond and coated with their Bernex™ 29 (multi-layer TiCN/Al$_2$O$_3$) chemical vapor deposition (CVD) coating. The samples were coated in a batch run. This ensured that the samples were coated under the same process conditions. After coating, the superalloy samples were given modified (non-standard) heat-treatment cycles to determine a suitable cycle for each super alloy.

Example 2: D2 Steel

Since D2 tool steel was selected as the control for the group, it was used for the first trial to ensure the vacuum furnace operated correctly and that the coating remained adhered during processing. The standard heat-treatment process for D2 was used on this trial. Table 11 shows the cycle times and temperatures for this standard process.

TABLE 11

D2 heat treatment process.
D2 Heat Treatment Process

| Cycle | Time and Temperature |
|---|---|
| Austenitizing | 30 min @ 1025° C. |
| Quench | 40 psi Nitrogen to 65° C. |
| Tempering | 2 hrs @ 500° C. air cool (2X) |

Examples 3-5: ATI 720™, Inconel® 718, and Rene 41™

From the preliminary ATI 720™ trials, it was apparent that the standard ATI 720™ heat treatment process would not give satisfactory results (the coating would dissipate during heat treating). Therefore, heat-treatment of the first coated ATI 720™ sample was done using a standard (D2 steel) 1025° C./30 minute austenitizing cycle with a nitrogen quench instead of the 1080° C./4 hour solutionizing cycle with an oil quench. The aging cycle was unaltered. The implications of modifying the solutionizing cycle will be discussed later. Table 12 shows the modifications that were made to the subsequent solutionizing times and temperature for ATI 720™. The goal was to get as close to the standard solutionizing heat treatment cycle as possible while still maintaining coating adhesion. The heat treatment cycles tested on Inconel® 718 and Rene 41™ are given in Tables 13 and 14, respectively. The standard solutionizing cycles were provided in Table 7 above.

TABLE 12

ATI 720 ™ heat treatment processes used for each trial.
ATI 720

| | Heat Treatment | | |
|---|---|---|---|
| | Solutionizing | Quench | Aging |
| Trial 1 | 30 min @ 1025° C. in −20 in Hg vacuum | 40 psi nitrogen | nitrogen atmosphere 24 Hrs @ 650° C. 6 psi nitrogen cool 16 hrs @ 760° C. 6 psi nitrogen cool |
| Trial 2 | 1 hr @ 1080° C. in −20 in Hg vacuum | 40 psi nitrogen | nitrogen atmosphere 24 Hrs @ 650° C. 6 psi nitrogen cool 16 hrs @ 760° C. 6 psi nitrogen cool |
| Trial 3 | 30 min @ 1080° C. in −20 in Hg vacuum | 40 psi nitrogen | nitrogen atmosphere 24 Hrs @ 650° C. 6 psi nitrogen cool 16 hrs @ 760° C. 6 psi nitrogen cool |

TABLE 13

Inconel ® 718 heat treatment processes used for each trial.
Inconel 718

| | Heat Treatment | | |
|---|---|---|---|
| | Solutionizing | Quench | Aging |
| Trial 1 | 1 hr @ 978° C. in −20 in Hg vacuum | Air cooled | nitrogen atmosphere 8 hrs @ 718° C. cooled at 56° C./hr to 621° C. held for 8 hrs 6 psi nitrogen cool |
| Trial 2 | 1 hr @ 978° C. in −20 in Hg vacuum | 6 psi nitrogen | nitrogen atmosphere 8 hrs @ 718° C. cooled at 56° C./hr to 621° C. held for 8 hrs 6 psi nitrogen cool |

TABLE 14

Rene 41 ™ heat treatment processes used for each trial.
Rene 41

| | Heat Treatment | | |
|---|---|---|---|
| | Solutionizing | Quench | Aging |
| Trial 1 | 2 hr @ 1080° C. in −20 in Hg vacuum | Air cooled | nitrogen atmosphere 16 hrs @ 760° C. 6 psi nitrogen cool |
| Trial 2 | 1 hr @ 1080° C. in −20 in Hg vacuum | 6 psi nitrogen | nitrogen atmosphere 16 hrs @ 760° C. 6 psi nitrogen cool |
| Trial 3 | 2 hr @ 1080° C. in −20 in Hg vacuum | 6 psi nitrogen | nitrogen atmosphere 16 hrs @ 760° C. 6 psi nitrogen cool |

Pin on Disc Wear Test: A select coated sample and one non-coated sample from each superalloy, ATI 720™, Rene 41™, and Inconel® 718, were sent to CSM Instruments (Switzerland) to undergo elevated temperature pin-on-disc wear testing. The selected coated sample was determined by a visual inspection of the sample to determine which one had the greatest amount of coating still adhered. The pin-on-disc wear test was used to determine the wear rate of the materials.

The wear rate test consists of a stylus loaded onto a test specimen with a specified force. The specimen rotates under the load of the stylus, which causes wear on the stylus and test material. The stylus is mounted on a lever designed to be a frictionless force transducer. The deflection of this lever was used to calculate the friction coefficient during the test. The amount of material worn from the stylus and test material is measured and used to calculate the wear coefficients. The rotational speed of the test material, contact pressure, and temperature are parameters that are specified to simulate the conditions seen in practice.

To determine the contact pressure for the test, the maximum extrusion ram pressure was calculated using Equation 1. This equation encompasses ideal deformation, non-uniform deformation and friction work as a function of process and material parameters.

$$P_e = C\left[\dot{\varepsilon}e^{\left(\frac{Q}{RT}\right)}\right]^m \left[\frac{\ln Re}{\eta} \bigg| \frac{m_f P_c l_b}{\sqrt{3} A_C}\right] \quad \text{Eq. 1}$$

where C is a material strength constant, Q is activation energy, R is gas constant, T is extrusion temperature, m is strain rate sensitivity, Re is extrusion ratio, $\eta$ is efficiency, $m_f$ is friction factor, $P_c$ is container perimeter, $l_b$ is billet length, $A_C$ is the cross sectional area of the container, and $\dot{\varepsilon}$ is the mean strain rate determined by Equation 2.

$$\dot{\varepsilon} = \frac{\ln Re}{t} \quad \text{Eq. 2}$$

where t is the deformation time calculated by Equation 3.

$$t = \frac{V_D}{v_r A_C} \quad \text{Eq. 3}$$

where $V_D$ is the die volume and $V_r$ is ram velocity. Table 15 lists material and process parameters for the lab-scale process currently under development.

TABLE 15

Extrusion process and material parameters for copper multi-channel tube extrusion at 750° C.

| | |
|---|---|
| Ram Velocity | 0.83 mm/s |
| Die Volume | 6500 mm³ |
| Cross Sectional Area Container | 346.46 mm² |
| Extrusion Ratio | 27.5 |
| Strength Constant | 0.571 MPa |
| Activation Energy | 234 kJ |
| Gas Constant | 8.314 J-mol/K |
| Extrusion Temperature | 1023 K |
| Efficiency | 0.215 |
| Friction Factor | .6 |
| Container Perimeter | 49.76 mm |
| Billet Length | 95.25 mm |
| Strain Rate Sensitivity | 0.16 |

The maximum speed achieved during extrusion was selected, which provided a worst case scenario for the die pressure. Using Equations 1-3, an upper bound value for the die pressure was calculated to be 691.0 MPa.

The force applied to the pin during the test is calculated using Equation 4.

$$F = \frac{2}{3}\pi a^2 P_{max} \quad \text{Eq. 4}$$

Where F is the applied load, a is the contact patch radius defined by Equation 5, and $P_{max}$ is the extrusion pressure.

$$a = \frac{\pi}{4}P_{max}\frac{m_1 + m_2}{B} \quad \text{Eq. 5}$$

Where $m_1$ is the pin material constant, $m_2$ is the sample material constant, and B is the geometry constant. The geometry constant B, for a sphere on a plane, is defined as:

$$B = \frac{1}{2}\frac{1}{R_p} \quad \text{Eq. 6}$$

where $R_p$ is the radius of the pin. The material constants $m_1$ and $m_2$ are calculated using Equation 7:

$$m_i = \frac{1 - v_i^2}{E_i} \quad \text{Eq. 7}$$

where $v_i$ is Poisson's ratio and $E_i$ is Young's modulus for each respective material.

An Al$_2$O$_3$ pin with 6 mm radius was used for the elevated temperature wear tests. Al$_2$O$_3$ has a Young's modulus of 300 GPa and a Poisson's ratio of 0.21. Using Equations 4-7, an applied pin load of 4.8 N was determined. The normal load is expected to be proportional to the wear coefficient as indicated by the Archard wear equation. Therefore, a higher force will lower the sliding distance required to complete the pin-on-disc test. The calculated pin-on-disc test parameters are a temperature of 750° C., linear speed of 0.83 cm/s, and a load of 4.8 N. During the actual testing of the samples a load of 2N was used. The test was also performed at 20 cm/s to complete the testing in a timely manner.

Discussion

Visual inspection of the samples coated by Ionbond revealed different colors on steel and superalloy samples. The coating on the D2 tool steel sample was a darker shade of brown compared to the ATI 720 super alloy sample. The color or tint of the coating depends on various factors. The substrate chemistry, especially carbon content, and the substrate crystal structure are the predominate factors. The growth rate of TiCN sub-layer of coating is determined by these factors. This layer determines the color of the coating because the alumina layer is semi-translucent. The color of the coating on the sample should not affect the coating adhesion. The D2 tool steel has 1.5% carbon content and the nickel based super alloys have no carbon in their composition, and this apparently accounts for the color difference.

D2 Tool Steel Heat Treating in Example 2 (Table 11): The CVD coated D2 steel sample was austenitized at 1025° C. for 30 minutes in a −20 inHg vacuum. It was quenched using 40 psi of nitrogen. The sample was tempered at 500° C. for 2 hours. The tempering operation was repeated for a total of two cycles. The coating remained adhered, as expected, during the heat treatment. The post-coating heat treatment cycle for this sample was used as a baseline of sorts for the processing of the nickel based superalloys. The hardness of the coated sample was found to be 59 HRC.

ATI 720™ Heat Treating in Example 3 (Table 12): Trial 1 for the ATI 720™ used the D2 austenetizing time-temperature cycle instead of the standard solutionizing cycle for this alloy. The sample was solutionized for 30 minutes at 1025° C. in a −20 inHg vacuum. The sample was quenched in 40 psi of nitrogen for 10 minutes. Visual inspection of the sample (post solution treatment) showed that coating adhesion appeared to be sufficient and comparable to that of the D2 steel sample. The coating remained intact after this process. The sample was then aged with the standard ATI 720™ cycle of 24 hours at 650° C., air cooling and then 16 hours at 760° C. All aging cycles were performed in a nitrogen atmosphere. The coating on the sample did not delaminate during this entire process. The pre-heat treatment hardness of the sample was 38 HRC and the post heat treatment hardness was 41 HRC.

Based on the results of trial 1, the second trial involved increasing the solutionizing time to 1 hour and the temperature to 1080° C. (the standard solution temperature for this alloy, but shorter time than standard). This process was done in a −20 inHg vacuum. During the quench with 40 psi of nitrogen, the top layer of the coating delaminated. The sample was aged using the standard ATI 720™ heat treatment cycle in a nitrogen atmosphere (per Table 9). Pre-heat treatment hardness of this sample was 37 HRC and the post heat treatment hardness was 39 HRC.

The third trial with ATI 720™ consisted of using a 30 minute solutionizing time at 1081° C. in a −20 inHG vacuum. The 40 psi nitrogen quench in this instance also caused some of the aluminum oxide layer to delaminate. Using the standard aging cycle, the sample was aged in a nitrogen atmosphere. This produced a post heat treatment hardness of 41 HRC.

Use of the D2 steel austenitizing time and temperature cycle of 1025° C. for 30 minutes as a replacement for the solutionizing cycle for ATI 720™ resulted in sufficient coating adhesion on this alloy. The modified heat treating process resulted in a sample hardness of 41 HRC, which is slightly lower than the desired value of 46 HRC. This may be the result of a lower dissolution of soluble inter-metallic phases which manifest as strengthening precipitates during aging. When the time and temperature was increased to one hour and 1080° C. the coating delaminated. Decreasing the solutionizing time to 30 minutes but keeping the temperature at 1080° C. still caused the coating to delaminate. A visual inspection of the trial 2 and trial 3 samples shows that more of the aluminum oxide layer of coating was lost during the second trial where the sample was solutionized for 1 hour.

Additionally, during the nitrogen quenching cycle, the coating was observed to disappear. The coating appeared to "crack." These cracks grew as if the coating layer was vaporizing. This was observed through the quartz furnace tube.

Inconel® 718 Heat Treating in Example 4 (Table 13): Trial 1 for the Inconel 718 used the standard heat treatment cycle for this alloy. The sample was solutionized for 1 hour at 978° C. in a −20 inHg vacuum. It was removed from the furnace and air cooled for the quench. The sample was aged in a nitrogen atmosphere for 8 hours at 718° C., cooled at 56° C./hr to 621° C. and held for 8 hours. With this heat treatment the CVD coating remained intact and produced a hardness of 37 HRC.

Trial 2 consisted of solutionizing the sample for 1 hour at 978° C. in a −20 inHg vacuum. The sample was quenched in 6 psi nitrogen. The sample was aged in a nitrogen atmosphere using the standard cycle. The hardness of the sample post heat treatment was 38 HRC. The coating remained adhered using this cycle.

Using the standard (solution) heat treating times and temperatures for Inconel® 718 did not result in the loss of the coating. Trial 1 consisted of air quenching the sample while trial 2 used a 6 psi nitrogen quench. Both trials did not show any significant loss of coating and this shows that the quench media (nitrogen and air) did not appear to significantly affect the coating. The hardness achieved with the coated sample was 38 HRC and this is lower than the desired 44 HRC hardness. A possible explanation for this is the manual control of the aging cycle's 56° C./hr cooling rate. The initial heat treatment was carried out in a programmable furnace.

Rene 41™ Heat Treating in Example 5 (Table 14): The first heat-treatment trial of a Rene 41™ sample was performed using a 2 hour solutionizing cycle at 1080° C. in a −20 inHg vacuum. The sample was removed from the furnace and allowed to air cool for the quench. This cycle caused most of the aluminum oxide layer of the coating to delaminate; this occurred approximately 5 minutes after the sample was removed from the furnace when it cooled and lost its red glow. The sample was aged in nitrogen for 16 hours at 760° C. The pre-heat treatment hardness was 37 HRC and there was no measurable increase in hardness post heat treatment.

For trial 2, the solutionizing time was decreased to 1 hour at 1080° C. in a −20 inHg vacuum. The sample was quenched with 6 psi of nitrogen. The coating appeared to remain intact on the sample. The sample was then aged using the standard cycle in a nitrogen atmosphere. This heat treatment resulted in the coating to remain on the sample and produced a hardness of 38 HRC.

For the third trial with this alloy, the solutionizing time was increased back to 2 hours at 1080° C. The sample was quenched in 6 psi of nitrogen instead of air, used in the first trial. Once again this process caused most of the aluminum oxide layer to disappear. This indicated that the type of quench, air versus nitrogen, did not affect the outcome. The sample was aged at 760° C. for 16 hours. The majority of the top layer of coating was gone.

Using a 2 hour solutionizing time (½ the standard time) for Rene 41™ caused the top layer of coating to disappear. This trial used an air quench. During trial 1 the sample was removed from the furnace, after 2 hours at 1080° C. It was placed on insulation to begin the air cool quench. After sitting in the air for approximately one minute, the coating cracked and began to shrink (and disappear). When the solution time was reduced to 1 hour in trial 2 (and a 6 psi nitrogen quench was used) the coating remained adhered to the sample. The desired hardness of 43 HRC was not achieved; the sample had a hardness of 38 HRC. Once again, this could be due to incomplete dissolution of second phases that provide the strengthening precipitates during aging. For trial 3 the time was increased back to 2 hours but unlike trial 1, a 6 psi nitrogen quench was used. This still caused the coating to delaminate with similar amounts of coating gone.

The modified solution cycle that produced a successfully coated Rene 41™ sample did not give the same results for ATI 720™. The only difference between the two trials is that Rene 41™ used a 6 psi nitrogen quench, while ATI 720™ used a 40 psi quench. A possible explanation to this occurring could be that the slow cool rate with the 6 psi quench allowed the substrate and coating to cool more closely at the same rate. This allowed the coating to contract with the substrate material. The 40 psi quench created a high cooling rate, which caused the coating to cool quicker, thus shrinking faster than the substrate material, causing it to "crack". There is little difference between their material compositions, shown in Table 1. The service temperature for the Bernex™ 29 CVD coating is 1000° C., which is lower than the solutionizing temperatures used on the samples. Another factor may be that the deposition temperature of the coating is 1020° C. and is held at this temperature for 30 minutes. When the samples are solutionized, the time and temperature are higher than when the coating was deposited.

For each nickel based super alloy, a successfully CVD coated sample with a modified heat treatment process was produced. The modified heat treatments caused approximately a 10% decrease in hardness from the typical hardness achieved from their standard heat treatment processes, but allowed the CVD coating to remain adhered to the material substrate.

Wear Tests: The coated and heat treated samples from Trial 1 of ATI 720™, Trial 2 of Inconel® 718, and Trial 2 of Rene 41™ as well as three polished non-coated samples, one of each super alloy, ATI 720™, Inconel® 718, and Rene 41® were sent to CSM Instruments for pin-on-disc wear testing. The tests were performed at 750° C. in air. A 6 mm diameter ball made of $Al_2O_3$ with a load of 2 N was applied to the samples at 20 cm/s for 2000 m. The front (A) and back (B) sides of each sample were tested to provide repeat results.

ATI 720™ Non-coated Wear Tests: Table 16 shows the results for the pin-on-disc wear testing of the non-coated ATI 720™ sample. The wear track depth of side A was measured at three different locations on the sample. The coefficient of friction for side A was 0.50 with a standard deviation of 0.034. The average wear rate determined by the pin-on-disc test for ATI 720™ was $6.32 \times 10^{-6}$ mm³/Nm for side A. This is based upon the mean area of the three wear track profiles. The average coefficient of friction during side B testing was determined to be 0.33 with a standard deviation of 0.015. The average wear depth for non-coated ATI 720™ was 3.68 μm.

TABLE 16

Wear test results for non-coated ATI 720 ™.
Non-Coated ATI 720

| Side | Measurement # | Wear Depth (μm) | Wear Rate (mm³/Nm) | Coefficient of Friction |
|---|---|---|---|---|
| A | 1 | 5.57 | $6.32 \times 10^{-6}$ | 0.499 |
|   | 2 | 5.50 |   |   |
|   | 3 | 6.32 |   |   |
| B | 1 | 1.25 | $1.6 \times 10^{-6}$ | 0.333 |
|   | 2 | 1.70 |   |   |
|   | 3 | 1.73 |   |   |

ATI 720™ CVD Coated Wear Tests: Side A of the CVD coated ATI 720™ sample had an overall wear rate of $2.56 \times 10^{-6}$ mm³/Nm. Test results are shown in Table 17. The average friction coefficient was 0.50. The average value of the coefficient of friction during the testing of side B was 0.46. The wear rate for side B was determined to be $1.13 \times 10^{-6}$ mm³/Nm. The CVD coated ATI 720™ sample had an average wear depth of 1.24 μm.

TABLE 17

CVD coated ATI 720 ™ wear test results.
CVD Coated ATI 720

| Side | Measurement # | Wear Depth (μm) | Wear Rate (mm³/Nm) | Coefficient of Friction |
|---|---|---|---|---|
| A | 1 | 1.58 | $2.56 \times 10^{-6}$ | 0.499 |
|   | 2 | 1.49 |   |   |
|   | 3 | 1.63 |   |   |
| B | 1 | 0.90 | $1.13 \times 10^{-6}$ | 0.46 |
|   | 2 | 0.77 |   |   |
|   | 3 | 1.04 |   |   |

Non-Coated Inconel® 718 Wear Tests: The overall wear rate for side A of the non-coated Inconel® 718 sample was determined to be $2.76 \times 10^{-5}$ mm³/Nm. The test results are listed in Table 18 for side A and B non-coated Inconel® 718. The wear rate on side B of the non-coated Inconel® 718 sample was determined to be $2.87 \times 10^{-5}$ mm³/Nm. The average value of the friction data during the pin-on-disc test of side B was 0.43. The average wear depth for non-coated Inconel® 718 was 7.78 μm.

TABLE 18

Non-coated Inconel ® 718 wear test results.
Non-Coated Inconel 718

| Side | Measurement # | Wear Depth (μm) | Wear Rate (mm³/Nm) | Coefficient of Friction |
|---|---|---|---|---|
| A | 1 | 4.58 | $2.76 \times 10^{-5}$ | 0.186 |
|   | 2 | 5.87 |   |   |
|   | 3 | 4.18 |   |   |
| B | 1 | 11.70 | $2.87 \times 10^{-5}$ | 0.426 |
|   | 2 | 11.50 |   |   |
|   | 3 | 9.33 |   |   |

CVD Coated Inconel® 718 Wear Tests: The results for CVD coated Inconel®718 sample are shown in Table 19. With side A an overall wear rate was found to be $4.63 \times 10^{-6}$ mm³/Nm. The friction coefficient of side A had an average friction value of 0.53. The average value for the coefficient of friction for side B was 0.43. The wear rate was determined to be $5.71 \times 10^{-6}$ mm$^3$/Nm. Coated Inconel® 718 showed an average wear depth of 1.47 μm.

TABLE 19

Wear test results for coated Inconel ® 718.
CVD Coated Inconel 718

| Side | Measurement # | Wear Depth (μm) | Wear Rate (mm$^3$/Nm) | Coefficient of Friction |
|---|---|---|---|---|
| A | 1 | 1.14 | $4.63 \times 10^{-6}$ | 0.553 |
|   | 2 | 1.04 | | |
|   | 3 | 1.94 | | |
| B | 1 | 1.57 | $5.71 \times 10^{-6}$ | 0.432 |
|   | 2 | 1.66 | | |

Non-Coated Rene 41™ Wear Tests: Non-coated Rene 41™ showed a wear rate of $2.3 \times 10^{-6}$ mm$^3$/Nm and a coefficient of friction of 0.27 on side A, while side B showed a wear rate of $1.72 \times 10^{-5}$ mm$^3$/Nm and coefficient of friction of 0.39. Table 20 shows the pin-on-disc test results. The average wear depth for this sample was 4.36 μm.

TABLE 20

Wear test results for non-coated Rene 41 ™.
Non-Coated Rene 41

| Side | Measurement # | Wear Depth (μm) | Wear Rate (mm$^3$/Nm) | Coefficient of Friction |
|---|---|---|---|---|
| A | 1 | 2.10 | $2.3 \times 10^{-6}$ | 0.272 |
|   | 2 | 2.21 | | |
|   | 3 | 1.47 | | |
| B | 1 | 5.52 | $1.72 \times 10^{-5}$ | 0.387 |
|   | 2 | 7.78 | | |
|   | 3 | 7.09 | | |

CVD Coated Rene 41™ Wear Tests: CVD coated Rene 41 side A had a wear rate of $3.16 \times 10^{-6}$ mm$^3$/Nm while side B had a wear rate of $6.13 \times 10^{-6}$ mm$^3$/Nm. The friction coefficient for side A averaged 0.47. Table 21 lists the results for the pin-on-disc test of this sample. Side B of coated Rene 41 had an average of 0.47 friction coefficient during the test. The average wear depth was 1.16 μm for CVD coated Rene 41™.

TABLE 21

CVD coated Rene 41 ™ wear test data.
CVD Coated Rene 41

| Side | Measurement # | Wear Depth (μm) | Wear Rate (mm$^3$/Nm) | Coefficient of Friction |
|---|---|---|---|---|
| A | 1 | 1.09 | $3.16 \times 10^{-6}$ | 0.469 |
|   | 2 | 1.28 | | |
|   | 3 | 1.22 | | |
| B | 1 | 0.98 | $6.13 \times 10^{-6}$ | 0.467 |
|   | 2 | 0.64 | | |
|   | 3 | 1.76 | | |

Wear Test Results Comparison: A list of the average wear data for each sample is summarized in Table 22. The coated ATI 720™ had the lowest wear rate among the samples while the non-coated Inconel® 718 had the highest wear rate. The average wear rate values show that when a sample was coated it lowered the wear rate by approximately half for that specific material. The ATI 720™ coated and non-coated samples had the lowest average wear rate compared to the other alloys. Non-coated Inconel® 718 had the highest wear rate.

TABLE 22

Average wear test results for each sample.
Wear Test Results (Averaged)

| Sample | Wear Rate mm$^3$/Nm | Friction Coefficient | Wear Depth (μm) |
|---|---|---|---|
| Non-Coated ATI 720 | $3.96 \times 10^{-6}$ | 0.42 | 3.68 |
| Coated ATI 720 | $1.85 \times 10^{-6}$ | 0.48 | 1.24 |
| Non-Coated Inconel 718 | $2.82 \times 10^{-5}$ | 0.43 | 7.78 |
| Coated Inconel 718 | $5.17 \times 10^{-6}$ | 0.48 | 1.47 |
| Non-Coated Rene 41 | $9.75 \times 10^{-6}$ | 0.33 | 4.36 |
| Coated Rene 41 | $4.66 \times 10^{-6}$ | 0.47 | 1.16 |

Friction coefficients were observed to be generally within 15% of each other, except for non-coated Rene 41™. Non-coated Rene 41™ was 23% lower than non-coated ATI 720™, which had the second lowest value. However, this sample had a high wear rate, showing that a lower friction did not produce a lower wear rate. The wear depth for the coated samples had values ranging from 0.64-1.94 μm. The typical thickness for Bernex™ 29 CVD coating is 9-14 μm with the Al$_2$O$_3$ layer being 3-5 μm and the TiCN layer being 6-9 μm. During wear testing of the samples the wear track penetrated less than a third of the way through the aluminum oxide layer. Non-coated samples had much higher wear depths than the CVD coated samples, ranging from 1.25-11.7 μm. Tables 2-4 (above) summarize the process data and average results for each alloy and coating condition.

Die Wear Life Model: To estimate die life for a copper multi-channel tube die, the following equation was proposed:

$$L = \frac{w}{\alpha} \qquad \text{Eq. 16}$$

where L is the length of tubing that can be extruded in meters, w is the wear depth to failure based on tubing tolerances, and α is a wear constant. This equation is based on previous studies, where it was determined that wear increased linearly as more material was extruded. The wear constant, α, is calculated from the pin-on-disc wear test data. The wear constant was calculated by the slope of the line when wear depth was plotted against sliding distance. The plot commenced at the test start, which corresponds to zero sliding distance and zero wear (the first data point). The second point was created by plotting the average wear depth against the sliding distance of 2000 m (i.e., the distance the tests were performed). Table 23 lists α values for the materials tested.

TABLE 23

Wear constant values.
Wear Constant Values

| Material | α |
|---|---|
| Non-Coated ATI 720 | 0.00184 |
| Coated ATI 720 | 0.00062 |
| Non-Coated Inconel 718 | 0.00393 |
| Coated Inconel 718 | 0.000735 |
| Non-Coated Rene 41 | 0.00218 |
| Coated Rene 41 | 0.00058 |

The coated ATI 720™ sample had the lowest wear rate; however the coated Rene 41™ sample had the smallest wear depth average. The wear rate is based on material volume lost, which factors in depth and width of the wear track. Die life should probably be based on the depth of wear on the die bearing surfaces. The wear constant values are based upon the wear track depths. This includes the surface roughness of the extruded part, which will be the most likely cause of part rejection. The aluminum oxide coating thickness of 5 μm was used for a first approximation of wear depth failure. Table 24 lists the length of tubing that could be extruded using this first approximation.

TABLE 24

First approximation of length of extruded tube before die failure due to wear. The first approximation is based on die failure due to a wear depth of 5 μm.

| Material | Length of Extruded Tube (meters) |
| --- | --- |
| Non-Coated ATI 720 | 2700 |
| Coated ATI 720 | 8100 |
| Non-Coated Inconel 718 | 1200 |
| Coated Inconel 718 | 6800 |
| Non-Coated Rene 41 | 2300 |
| Coated Rene 41 | 8600 |

The first approximation indicates that a coated Rene 41™ die will produce the most tube before die wear failure. Again, this is based on wear depth and not wear rate, coated ATI 720™ had the lowest wear rate followed by Rene 41™. This approximation also indicates that non-coated ATI 720™ will produce the largest amount of tube before die wear failure among the non-coated samples. The projected coated-die extruded tubing lengths are at least 3 times longer than the projected non-coated die extruded tube lengths.

Three nickel based super alloys, ATI 720™, Inconel® 718, and Rene 41™ were successfully coated with Bernex™ 29 chemical vapor deposition coating. The (alloy strengthening) heat treating processes for these materials were modified to maintain coating adhesion during the post-coating heat treatment. These modified heat treatment processes resulted in a 10% reduction from typical hardness values of the alloys. However the modified cycles were necessary for the coating to remain on the samples. Tests showed that wear rates decreased by at least 50% for samples that were coated. Coated ATI 720™ provided the lowest overall wear rate $1.85 \times 10^{-6}$ mm$^3$/Nm. A die life wear model was developed and it predicts that CVD coated Rene 41™ would produce the longest length of tube before die failure.

As used herein and in the appended claims, the singular forms "a", "an", and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

While the present invention has been illustrated by the description of one or more embodiments thereof, and while the embodiments have been described in considerable detail, they are not intended to restrict or in any way limit the scope of the appended claims to such detail. The various features of exemplary embodiments described herein may be used in any combination. Additional advantages and modifications will readily appear to those skilled in the art. The invention in its broader aspects is therefore not limited to the specific details, representative product and method and illustrative examples shown and described. Accordingly, departures may be made from such details without departing from the scope of the general inventive concept.

What is claimed is:

1. A method of making an extrusion die tool component, the method comprising:
    coating at least one portion of an extrusion die tool component comprising a nickel-based super alloy with a wear resistant coating comprising TiCN at a high temperature; and
    hardening the extrusion die tool component and the at least one coated portion, the hardening comprising:
        solutionizing under a first set of conditions that includes heating the coated die tool component in a vacuum;
        quenching under a second set of conditions that includes cooling the coated die tool component to about room temperature by applying a gas or air under pressure; and
        aging under a third set of conditions.

2. The method of claim 1, wherein the extrusion die tool component is selected from the group consisting of a die body, a mandrel, and a plate.

3. The method of claim 1, wherein the nickel-based super alloy is selected from the group consisting of Nickel alloy 41, Nickel alloy 718, and Nickel alloy 720.

4. The method of claim 1, wherein the wear resistant coating is a bi-layer that comprises an inner layer comprising TiCN bonded to a surface of the extrusion die component, and an outer layer comprising Al$_2$O$_3$ overlying the inner layer.

5. The method of claim 4, wherein the inner layer comprises one or more layers comprising at least one of TiC or TiN.

6. The method of claim 1, wherein coating at least one portion of the extrusion die tool comprises a chemical vapor deposition (CVD) process or a physical vapor deposition (PVD) process.

7. The method of claim 1, wherein the die tool component is selected from the group consisting of a mandrel and a plate; wherein the nickel-based super alloy is selected from the group consisting of Nickel alloy 41, Nickel alloy 718, and Nickel alloy 720; and wherein the wear resistant coating comprises one or more layers of Al$_2$O$_3$, and one or more layers of TiCN.

8. The method of claim 1, wherein the wear resistant coating comprises one or more layers comprising at least one of TiC or TiN.

9. The method of claim 1, wherein the first set of conditions includes heating the coated die tool component for about 30 minutes or about 1 hour at about −20 inHg vacuum, and the third set of conditions includes heating the coated die tool component under a nitrogen atmosphere and cooling the coated die component to room temperature under the nitrogen atmosphere.

10. A method of making an extrusion die tool, the method comprising:
    coating at least one portion of an extrusion die tool component comprising Nickel alloy 720 with a wear resistant coating at a high temperature; and
    hardening the extrusion die tool component and the at least one coated portion, the hardening comprising:

solutionizing under a first set of conditions that includes heating the coated die tool component at about 1025° C. for about 30 minutes at about −20 inHg vacuum;

quenching under a second set of conditions that includes cooling the coated die tool component by applying about 40 pounds per square inch (psi) nitrogen until the coated die tool component is at about room temperature; and aging under a third set of conditions that includes heating the coated die tool component at about 650° C. for about 24 hours under about 6 psi nitrogen atmosphere, cooling the coated die tool component to about room temperature by applying about 6 psi nitrogen, heating the coated die tool component at about 760° C. for about 16 hours under about 6 psi nitrogen atmosphere, and cooling the coated die tool component to room temperature by applying about 6 psi nitrogen.

11. A method of making an extrusion die tool, the method comprising:

coating at least one portion of an extrusion die tool component comprising Nickel alloy 718 with a wear resistant coating at a high temperature; and hardening the extrusion die tool component and the at least one coated portion, the hardening comprising:

solutionizing under a first set of conditions that includes heating the coated die tool component at about 978° C. for about 1 hour at about −20 inHg vacuum;

quenching under a second set of conditions that includes cooling the coated die tool component to about room temperature by applying about 6 psi nitrogen; and aging under a third set of conditions that includes heating the coated die tool component at about 718° C. for about 8 hours under a nitrogen atmosphere, cooling the coated die component at about 56° C./hr to about 621° C. under about 6 psi nitrogen, maintaining the coated die tool component at about 621° C. for about 8 hours under the nitrogen atmosphere, and cooling the coated die component to room temperature under about 6 psi nitrogen.

12. A method of making an extrusion die tool, the method comprising:

coating at least one portion of an extrusion die tool component comprising Nickel alloy 41 with a wear resistant coating at a high temperature; and hardening the extrusion die tool component and the at least one coated portion, the hardening comprising:

solutionizing under a first set of conditions that includes heating the coated die tool component at about 1080° C. for about 1 hour at about −20 inHg vacuum;

quenching under a second set of conditions that includes cooling the coated die tool component to about room temperature by applying about 6 psi nitrogen; and aging under a third set of conditions that includes heating the coated die tool component at about 760° C. for about 16 hours under a nitrogen atmosphere, and cooling the coated die component to room temperature under about 6 psi nitrogen.

* * * * *